US006368404B1

(12) United States Patent
Gurary et al.

(10) Patent No.: US 6,368,404 B1
(45) Date of Patent: Apr. 9, 2002

(54) INDUCTION HEATED CHEMICAL VAPOR DEPOSITION REACTOR

(75) Inventors: Alexander I. Gurary, Bridgewater;
Paul Thomas Fabiano, Lebanon;
David Russell Voorhees, Hopewell;
Scott Beherrell, Phillipsburg, all of NJ (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 09/298,079

(22) Filed: Apr. 23, 1999

(51) Int. Cl.[7] .............................................. C30B 25/12
(52) U.S. Cl. .......................... 117/89; 117/92; 117/103; 117/951; 118/724; 118/725
(58) Field of Search .............................. 117/951, 89, 92, 117/103; 118/724, 725

(56) References Cited

U.S. PATENT DOCUMENTS

| 3,633,537 A | 1/1972 | Howe |
| 4,632,058 A | 12/1986 | Dixon et al. |
| 5,062,386 A | 11/1991 | Christensen |
| 5,074,017 A | 12/1991 | Toya et al. |
| 5,317,132 A | * 5/1994 | Clough et al. .............. 219/543 |
| 5,463,978 A | * 11/1995 | Larkin et al. ................. 117/89 |
| 5,527,393 A | 6/1996 | Sato et al. |
| 5,536,918 A | 7/1996 | Ohkase et al. |
| 5,633,081 A | * 5/1997 | Clough et al. .............. 428/331 |
| 5,700,725 A | 12/1997 | Hower et al. |
| 5,759,263 A | * 6/1998 | Nordell et al. ................ 117/98 |
| 5,835,678 A | 11/1998 | Li et al. |
| 5,964,943 A | * 10/1999 | Stein et al. .................... 117/88 |
| 6,031,211 A | * 2/2000 | Mailho et al. .............. 219/486 |

FOREIGN PATENT DOCUMENTS

JP          10-12364      * 1/1998

* cited by examiner

Primary Examiner—Robert Kunemund
(74) Attorney, Agent, or Firm—Lerner, David, Littenberg, Krumholz & Mentlik, LLP

(57) ABSTRACT

A chemical vapor deposition reactor includes a pancake type induction heating device to achieve operating temperature within the reactor chamber. By design of the susceptor, the induction magnetic force created at the top surface of the susceptor is insufficient to effect levitation of the wafer carrier during epitaxial deposition at high temperatures in the order of about 1500–1800° C.

29 Claims, 2 Drawing Sheets

INDUCTION HEATED CHEMICAL VAPOR DEPOSITION REACTOR

FIELD OF THE INVENTION

The present invention relates in general to chemical vapor deposition reactors, and more particularly, to metal organic chemical vapor phase deposition reactors. Still more particularly, the present invention relates to rotating wafer reactors in which one or more gasses are injected onto the surface of a rotating wafer carrier holding a wafer for growing various epitaxial layers and films thereon, and in particular, films of silicon carbide.

BACKGROUND OF THE INVENTION

Metal organic chemical vapor deposition (MOCVD) reactors have taken various forms, including horizontal reactors in which the wafer is mounted at an angle to the impinging process gases; horizontal reactors with planetary rotation in which the gases pass across the wafers; barrel reactors; and recently, vertical high-speed rotating disk reactors in which the gas or gases are injected downwardly onto a substrate surface which is rotating within a reactor. These types of MOCVD reactors have been found useful for wide varieties of epitaxial compounds, including various combinations of semiconductor single films and multilayered structures such as lasers and LED's.

Deposition of certain materials such as SiC semiconductor material requires wafer temperature levels up to about 1800° C. in a hydrogen environment with temperature uniformity of about +/−5° C. during long deposition runs, e.g., up to 6–8 hours. Conventional radiant heating elements made of graphite cannot provide this temperature level especially in the hydrogen environment. Radiant heating elements made of tungsten cannot provide temperature stability due to dimensional non-stability, i.e., warpage. As a result, induction heating has been used when high temperature levels such as about 1500–1800° C. have to be provided in a hydrogen environment.

Vertical high speed MOCVD rotating disk epitaxial reactor technology has been known to provide ideal flow and thermal conditions for SiC growth. Pancake type induction coils located below a susceptor in conventional reactors can provide uniform heating for the susceptor and wafer carrier. The wafer carrier has to be transferred from the load lock to the reactor (to prevent reactor explosion to atmosphere) and therefore located on the susceptor only under gravity force. One problem with this approach is levitation of the wafer carrier due to interaction between induction coil current and current generated in the wafer carrier. For example, as shown in FIG. 1, a known MOCVD reactor includes a susceptor 100 connected for rotation to a spindle 102. The susceptor 100 is positioned overlying a pancake type induction heating device 104 in the nature of a spiral coil. The induction heating device 104 is generally the type known in the art which is suitable for heating the reaction chamber to a temperature up to about 1800° C. in a hydrogen environment as is required for the epitaxial deposition of SiC. A wafer carrier 106 supporting multiple wafers 108 is removably positioned on the top surface of the susceptor 100.

Dashed lines 110 schematically represent the induction magnetic field created by the induction heating device 104 to provide its heating. The wafer carrier 106 being carried by the susceptor 100 is positioned within the strong induction magnetic field created by the induction heating device 104. The wafer carrier 106 is accordingly heated mostly by the induction field and partially by heat radiation from the susceptor 100. It has been found that the strong magnetic field 110 generated by the induction heating device 104, particularly when heating wafers 104 to a temperature of about 1800° C. as required for SiC epitaxial deposition, results in the magnetic field being sufficiently strong to cause levitation of the wafer carrier 106. The resulting levitation of the wafer carrier 106 causes its decoupling from the induction heating device 104 and susceptor 100 thereby making further heating or maintaining process temperature with the MOCVD reactor impossible.

Applicants have attempted various ways to eliminate wafer carrier levitation. For example, Applicants have increased wafer carrier (usually made of graphite with SiC coating) weight by increasing its thickness. This, however, has resulted in an undesirable temperature gradient across the thick wafer carrier and unavoidable cracking of the SiC layer. Another approach was to make the wafer carrier of Mo or W having a higher density than graphite. These materials although useful generally cannot be obtained with the same high purity as SiC coated graphite and will contaminate the deposition process. Another approach pursued by Applicants was the use of a locking mechanism between the wafer carrier and susceptor. As the locking mechanism is present in the reactor chamber at a very high temperature (high diffusion rates), it is subjected to the SiC deposition, as well as fusing together by diffusion under the long processes times generally used, e.g., 6–8 hours. As a result of the SiC coating, one cannot expect reliable performance from this locking system.

Accordingly, there is an unsolved need for designing a reactor for depositing, such as by chemical vapor deposition, a film of material, such as an epitaxial film of SiC, onto a wafer which prevents levitation of the wafer carrier as a result of the induction magnetic field generated by the induction heating device.

SUMMARY OF THE INVENTION

It is an object of the present invention to provide a reactor for depositing a film or material layer onto a wafer which is operative in a temperature range of up to about 1800° C. for deposition of various materials such as epitaxial SiC.

Another object of the present invention is to provide an induction heated chemical vapor deposition reactor wherein the wafer carrier is significantly decoupled from the induction magnetic field created by the induction heating device.

Another object of the present invention is to provide an induction heated chemical vapor deposition reactor which enables efficient heating of the wafer carrier without the use of mechanical clamps for maintaining the wafer carrier in contact with the susceptor.

According to the present invention the susceptor has a thickness sufficient to significantly decouple the wafer carrier from the induction field created by the induction heating device eliminating the levitation effect. In this case, the wafer carrier is generally heated only by radiation from the susceptor that is heated by the induction coil. Required carrier/susceptor thickness ratio depends on their materials of construction, induction coil frequency, set up geometry and can be defined by modeling using Finite Element Analysis with following fine tuning by experimental iteration.

In accordance with one embodiment of the present invention there is described a reactor for depositing a film of material onto a wafer, the reactor comprising a reactor chamber, an induction heating device, a susceptor having a bottom surface facing the induction heating device and a top surface facing away from the induction heating device, the top surface operative for supporting a wafer carrier having at least one wafer for depositing a film of material thereon, wherein the susceptor is constructed whereby an induction magnetic force generated by the induction heating device at the top surface of the susceptor is insufficient to cause levitation of the water carrier from the susceptor.

In accordance with another embodiment of the present invention there is described a reactor for depositing an epitaxial film of SiC onto the surface of a wafer, the reactor comprising a reactor chamber, an induction heating device operative for heating the wafer to a temperature greater than about 1600° C., a susceptor having a bottom surface facing the induction heating device and a top surface facing away from the induction heating device, and a wafer carrier positionable on the top surface of the susceptor for supporting at least one wafer for depositing an epitaxial film of material thereon within the reactor chamber, wherein the top surface of the susceptor is positioned at a location sufficiently remote from the induction heating device such that an induction magnetic force generated thereat by the induction heating device is insufficient to cause levitation of the wafer carrier therefrom.

In accordance with another embodiment of the present invention there is described a method for preventing levitation of a wafer carrier in a reactor for depositing an epitaxial film of material onto a wafer supported by the wafer carrier, the reactor including a susceptor having a surface for supporting the wafer carrier overlying an induction heating device, the method comprising constructing the susceptor whereby an induction magnetic force generated by the induction heating device at the surface of the susceptor is insufficient to cause levitation of the wafer carrier.

BRIEF DESCRIPTION OF THE DRAWINGS

The above description, as well as further objects, features and advantages of the present invention will be more fully understood with reference to the following detailed description of an induction heated chemical vapor deposition reactor, when taken in conjunction with the accompanying drawings, wherein.

DETAILED DESCRIPTION OF THE PREFERRED EMBODIMENTS

In describing the preferred embodiments of the subject matter illustrated and to be described with respect to the drawings, specific terminology will be resorted to for the sake of clarity. However, the invention is not intended to be limited to the specific terms so selected, and is to be understood that each specific term includes all technical equivalence which operate in a similar manner to accomplish a similar purpose.

Figure 1:
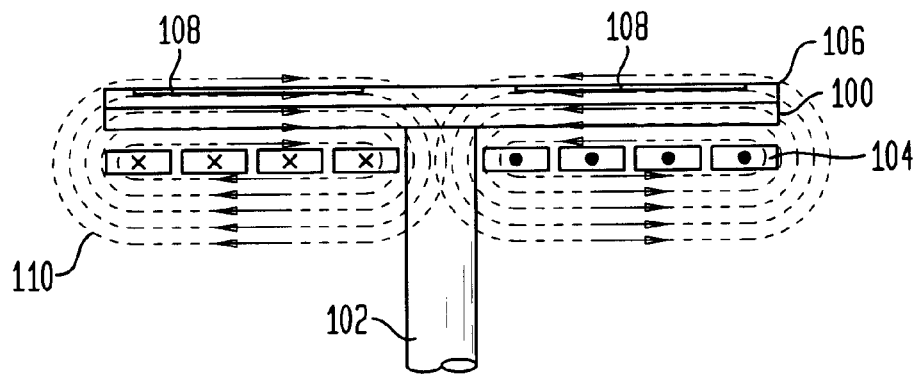
FIG. 1 is a diagrammatic illustration of a prior art reactor for deposition of epitaxial films using an induction heating device.
Figure 2:
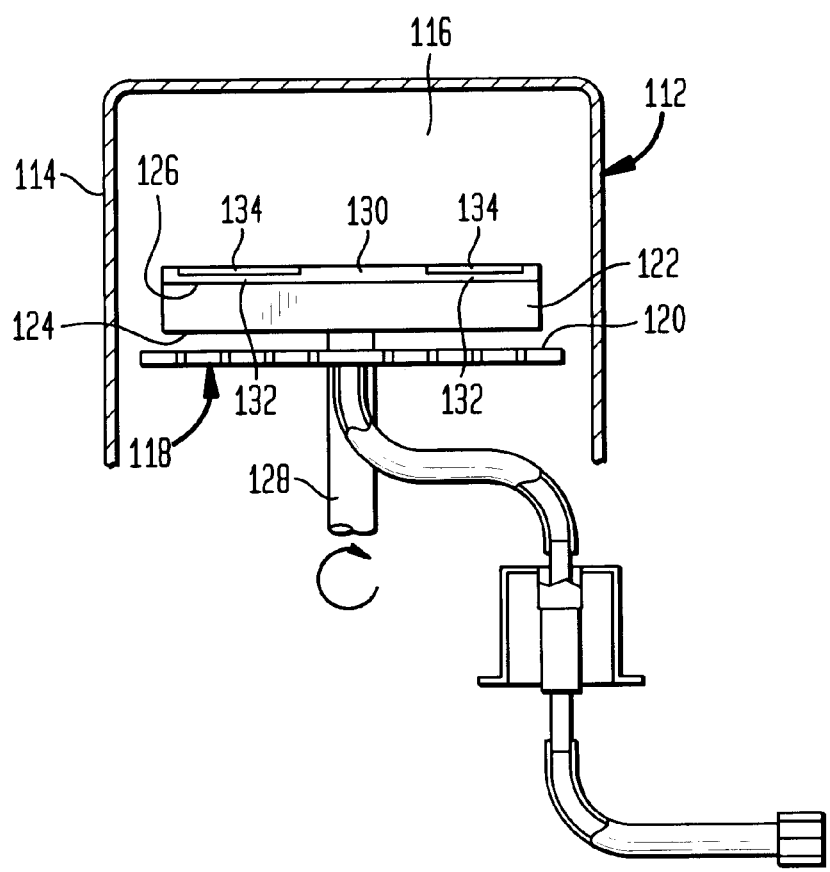
FIG. 2 is a diagrammatic illustration of a reactor for depositing an epitaxial film of material onto a wafer in accordance with one embodiment of the present invention.
Figure 3:
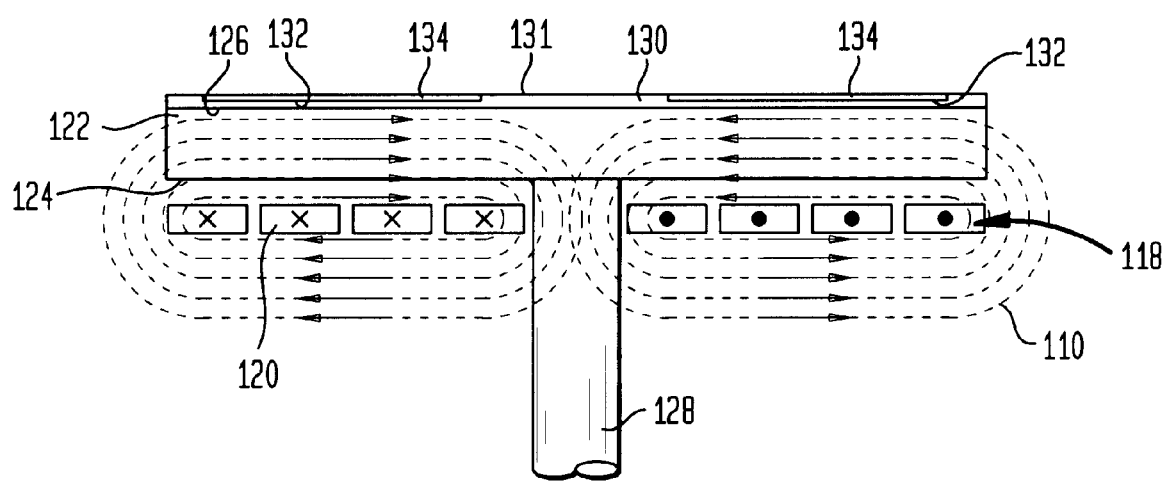
FIG. 3 is a diagrammatic illustration illustrating the construction of the susceptor in accordance with one embodiment of the present invention.

Referring now to FIGS. 2 and 3, there is schematically illustrated a reactor generally designated by reference numeral 112 specifically suitable for depositing an epitaxial film of material onto a wafer. The reactor 112 includes a housing 114 which defines a reactor chamber 116. Positioned within the reactor chamber 116 is a pancake type induction heating device 118 in the nature of a radio frequency induction coil of the type known for use in chemical vapor deposition reactors. A susceptor 122 is positioned overlying the induction heating device 118. The susceptor 122 has a bottom surface 124 facing the induction heating device 118 and a top surface 126 facing away from the induction heating device. The susceptor 122 is mounted to a spindle 128 which is operative for rotation of the susceptor during the chemical vapor deposition process. The housing 114 is provided with a closable opening (not shown) which enables access to the reactor chamber 116 for positioning a wafer carrier 130 onto the top surface 126 of the susceptor 122. The wafer carrier 130 is provided with one or more recessed portions 132 operative for receiving a wafer 134. The construction of the recessed portions 132 are such that the top surface of the wafer 134 is generally flush with the top surface of the wafer carrier 130.

The aforementioned components of the reactor 112 for chemical vapor deposition are generally well known in the art. For example, chemical vapor deposition reactors such as MOCVD reactors are available from the assignee of the present application, Emcore Corporation of Somerset, N.J. In general, the reactor 112 of this type is operative for the chemical vapor deposition of an epitaxial layer of material onto the surface of wafers 134 during operation of the reactor. A variety of film materials may be epitaxially grown on the wafers 134, for example, silicon carbide, gallium nitride, gallium arsenide, indium gallium arsenide, aluminum gallium arsenide and the like. Specific processes for forming epitaxial layers from the aforementioned materials are likewise well known in the art. For example, general reference is made to U.S. Pat. No. 5,835,678, which patent is assigned to the assignee of the present application and whose disclosure is incorporated herein by reference. Accordingly, a further description of the general construction of a chemical vapor deposition reactor 112, and more particularly a MOCVD reactor, as well as its operation in epitaxial growth of various materials from precursor materials will not be further described.

The present invention is specifically directed to addressing the problem of levitation of the wafer carrier 130 in reactors 112 which are operated at relatively high temperatures to effect the epitaxial deposition of the material layer. In particular, and by way of example only, the problem of levitation occurs during the epitaxial deposition of silicon carbide material which requires deposition temperatures in the range of from about 1600–1800° C. At these high deposition temperatures, for example, above 1500° C., the induction heating device 118 which may be operated at about 30 KHz to about 400 MHz creates an induction magnetic field at the top surface 126 of the susceptor 122 sufficient to cause levitation of the wafer carrier 130. As previously noted, levitation of the wafer carrier 106 results in a number of disadvantages. For example, levitation of the wafer carrier 130 results in the separation of the wafer carrier from the top surface of the susceptor 122 which may cause the coupling from the induction heating device 104. In addition, as the susceptor 122 is being spun at high speeds during the epitaxial deposition, the wafer carrier 130 will lose its orientation and rotational support with respect to the susceptor 122 which will adversely effect the epitaxial deposition process.

The present invention will now be described by way of one example with reference to FIG. 3. The wafer carrier 130 can be constructed from a variety of materials, and preferably graphite which is provided with a silicon carbide coating. The wafer carrier 130 is dimensioned to provide a top surface 131 of sufficient size to accommodate at least one, and preferably, a plurality of recessed portions 132. The recessed portions 132 are operative for receiving a wafer 134 upon which an epitaxial film is to be deposited within the reactor chamber 116. Wafers 134 may have a diameter of 2, 3, 4, 6 or 8 inches. Typically, the wafer carrier 130 will be circular having a diameter sufficient to accommodate the number of recessed portions 132 required for the number of wafers 134 being processed. By way of one example only, wafer carriers having a diameter in the range of about 3 to 16 inches may be used in the reactor 112 of the present invention. It is to be understood that wafer carriers 130 outside this range can also be used. The thickness of the wafer carrier 130 generally will be in the range of between ⅛ of an inch to about ¼ of an inch, although wafer carriers outside this range can also be used. As will be understood from a further description of the present invention, the thickness of the wafer carrier 130 can be increased to provide additional weight so as to overcome the induction magnetic force created by the induction heating device 118 to offset the levitation effect. The particular thickness of the wafer carrier 130, and hence, its weight, is one factor in designing the reactor 112 which prevents levitation of the wafer carrier 130. Other factors will be described hereinafter.

The susceptor 122 is generally formed in the nature of a cylindrical member having an uniform thickness which is rotationally supported by the spindle 128. By way of example, the susceptor 122 may be formed from a variety of materials, for example, graphite, tungsten or molydemum. Preferably, the susceptor 122 is constructed from molydemum or tungsten. The diameter of the susceptor 122 can vary depending upon the size of the wafer carrier 130. In particular, as the heating of the wafer carrier 130 by means of the susceptor 122 is primarily from radiation and conduction from the susceptor, a large top surface area is preferred, although not essential to the present invention. However, as the diameter of the susceptor 122 increases, more energy will be required for heating same to the process temperature, resulting in a greater levitation effect. Generally, the diameter of the susceptor 122 will be about the same as the wafer carrier 130, i.e., about 3–16 inches. The thickness of the susceptor 122 for the example as thus far described will generally be in the range of from about ¼ to 1⅛, although a susceptor outside this range may be used. The thickness is measured in the vertical direction between the top and bottom surfaces 124, 126 of the susceptor 122. By varying the thickness of the susceptor 122, the top surface 126 will be positioned at different locations with respect to the induction heating device 118, and accordingly, the induction magnetic field. That is, the further away the top surface 126 of the susceptor 122 is from the induction heating device 118, the weaker the induction magnetic field, and hence, the levitation effect on the wafer carrier 130.

The present invention decouples the levitation force created by the induction magnetic field generated by the induction heating device 118 on the wafer carrier 130 to prevent its levitation from the surface of the susceptor 122. To achieve this objective of substantially eliminating the levitation effect, the magnitude of the induction magnetic field is calculated at the location of the top surface 126 of the susceptor 122. By way of example, it is preferred to have the lifting force created by the induction magnetic field to be about 10–15% less than the weight of the wafer carrier 130 thereby ensuring inhabitation of levitation of the wafer carrier.

In calculating the induction magnetic force at the top surface 126 of the susceptor 122, various factors are considered. For example, the materials of construction of the susceptor 122 and wafer carrier 130, the diameter and thickness of the susceptor and wafer carrier, the operating frequency of the induction heating device 118, the weight of the susceptor and wafer carrier, the thickness ratio of the susceptor and wafer carrier, and any other factor which would influence the magnitude of the induction magnetic force particularly at the top surface 126 of the susceptor 122. With respect to the ratio of thickness between the susceptor 122 and wafer carrier 130, it is to be understood that as the wafer carrier thickness increases, its weight accordingly increases thereby allowing the wafer carrier to overcome a greater induction magnetic force which is created by the induction heating device 118. Similarly, the magnetic induction force at the top surface 126 of the susceptor 122 will decrease as the susceptor thickness increases. Hence, there is an inverse relationship between the wafer carrier thickness and susceptor thickness. That is, as the susceptor thickness increases, it is possible to provide thinner wafer carriers. On the other hand, as the susceptor thickness decreases, it is required that the wafer carrier thickness increase. It is to be further understood that as the operating temperature of the reactor 112 increases, a greater amount of energy will be input into the induction heating device to achieve the desired temperatures for the epitaxial process being performed in the reaction chamber 116. In turn, the higher temperatures will result in a greater magnitude of magnetic induction force at the top surface 126 of the susceptor 122.

From the foregoing variables, one can design the susceptor 122 and wafer carrier 130 so as to prevent levitation of the wafer carrier when operating at the desired processed temperature by trial and error approach. On the other hand, Finite Element Analysis software to calculate the induction magnetic force is known from Magsoft Corporation of Troy, N.Y., Ansys of Canonsburg, Pa. and Vector Fields of Aurora, Ill. The commercial available software from the aforementioned companies can be used as modeling tools to calculate the induction magnetic force for particular design of the reactor 112 such that the induction magnetic force at the top surface 126 of the susceptor 122 will be less than the weight of the wafer carrier 130 to prevent levitation.

By way of one illustrative example, and not intended as any limitation on the scope of the present invention, the reactor 112 is designed for the epitaxial deposition of silicon carbide at a process temperature of about 1800° C. The wafer carrier 130 is constructed of graphite material having a silicon carbide coating. The wafer carrier 130 having a 7 inch diameter is provided with 6 recessed portions 132 operative for receiving 2 inch diameter wafers 134. The thickness of the wafer carrier 130 is ⅛ inches. The susceptor is constructed from molydemum material having a diameter of 7 inches and a thickness of ½ inches. The induction heating device 118 is heated at a frequency of about 400 MHz. During deposition of silicon carbide material onto the surface of the wafers 134, the resulting construction of the susceptor 122 and wafer carrier 130 prevents levitation of the wafer carrier.

Although the invention herein has been described with reference to particular embodiments, it is to be understood that the embodiments are merely illustrative of the principles and application of the present invention. It is therefore to be understood that numerous modifications may be made to the embodiments and that other arrangements may be devised without departing from the spirit and scope of the present invention as defined by the claims.

What is claimed:

1. A reactor for depositing a film of material onto a wafer, said reactor comprising a reactor chamber, an induction heating device operative for heating said wafer to a temperature of greater than 1500° C., a susceptor having a bottom surface overlying said induction heating device and a top surface facing away from said induction heating device, said top surface operative for supporting a wafer carrier without restraint having at least one wafer for depositing a film of material thereon, wherein said susceptor is constructed to decouple the levitation force created by the induction magnetic field generated by the induction heating device whereby the induction magnetic force generated by said induction heating device at the top surface of said susceptor is insufficient to cause levitation of an unrestrained water carrier from said susceptor during deposition at a temperature greater than 1500° C.

2. The reactor of claim 1, wherein said wafer carrier is constructed of graphite having a SiC coating.

3. The reactor of claim 2, wherein said wafer carrier has a thickness in the range of about ⅛" to about 1¼".

4. The reactor of claim 1, wherein said susceptor is constructed from materials selected from the group consisting of graphite, tungsten and molybdenum.

5. The reactor of claim 4, wherein said susceptor has a thickness in the range of about ¼" to about 1¼".

6. The reactor of claim 1, wherein said susceptor is constructed from graphite having a SiC coating.

7. The reactor of claim 1, wherein said film of material is selected from the group consisting of SiC or GaN.

8. The reactor of claim 1, wherein said induction heating device is operative for heating said wafer to a temperature greater than 1500° C.

9. The reactor of claim 1, wherein said induction heating device is operative for heating said wafer to a temperature of about 1600 to about 1800° C.

10. The reactor of claim 9, wherein said film of material comprises SiC.

11. The reactor of claim 1, wherein said susceptor is constructed to have a predetermined thickness between said top and bottom surfaces whereby said top surface is positioned relative to said induction heating device such that the generated induction magnetic force at said top surface is insufficient to cause levitation of said wafer carrier.

12. The reactor of claim 1, wherein said wafer carrier has a weight greater than the induction magnet force generated at the top surface of said susceptor.

13. The reactor of claim 1, wherein said induction heating device comprises a flat pancake coil.

14. A reactor for depositing an epitaxial film of SiC onto the surface of a wafer, said reactor comprising a reactor chamber, an induction heating device operative for heating said wafer to a temperature greater than about 1600° C., a susceptor having a bottom surface overlying said induction heating device and a top surface facing away from said induction heating device, and a wafer carrier positionable without restraint on said top surface of said susceptor for supporting at least one wafer for depositing an epitaxial film of material thereon within said reactor chamber, said susceptor constructed to decouple the levitation force created by the induction magnetic field generated by the induction heating device whereby said top surface of said susceptor is positioned at a location sufficiently remote from said induction heating device such that an induction magnetic force generated thereat by said induction heating device is insufficient to cause levitation of an unrestrained wafer carrier therefrom during deposition at a temperature greater than 1600° C.

15. The reactor of claim 14, wherein said wafer carrier is constructed of graphite having an SiC coating.

16. The reactor of claim 14, wherein said susceptor is constructed from materials selected from the group consisting of graphite, tungsten and molybdenum.

17. The reactor of claim 13, wherein said susceptor is constructed from graphite having an SiC coating.

18. The reactor of claim 13, wherein said wafer carrier has a weight greater than the induction magnet force generated at the top surface of said susceptor.

19. The reactor of claim 14, wherein said induction heating device comprises a flat pancake coil.

20. A method for preventing levitation of an unrestrained wafer carrier in a reactor for depositing an epitaxial film of material onto a wafer supported by said wafer carrier, said reactor including a susceptor having a surface for supporting an unrestrained wafer carrier overlying an induction heating device, said heating device operative for heating said wafer to a temperature of greater than 1500° C., said method comprising constructing said susceptor to decouple the levitation force created by the induction magnetic field generated by the induction heating device whereby an induction magnetic force generated by said induction heating device at said surface of said susceptor is insufficient to cause levitation of said unrestrained wafer carrier during deposition at a temperature greater than 1500° C., and placing a wafer carrier unrestrained on the surface of said susceptor during deposition of an epitaxial film on a wafer being supported thereon.

21. The method of claim 20, further including constructing said wafer carrier from graphite coated with SiC.

22. The method of claim 20, further including constructing said susceptor from materials selected from the group consisting of graphite, tungsten and molybdenum.

23. The method of claim 20, further including constructing said susceptor from graphite having an SiC coating.

24. The method of claim 20, wherein the weight of said wafer carrier is greater than the induction magnetic force generated by said induction heating device at said surface of said susceptor.

25. The method of claim 20, wherein said film of material is selected from the group consisting of SiC or GaN.

26. The method of claim 20, wherein said induction heating device is operative for heating said wafer to a temperature greater than 1500° C.

27. The method of claim 20, wherein said induction heating device is operative for heating said wafer to a temperature of about 1600 to about 1800° C.

28. The method of claim 20, wherein said induction heating device comprises a flat pancake coil.

29. The method of claim 28, wherein said susceptor includes a bottom surface, and positioning said flat pancake coil underlying said susceptor at a location opposing said bottom surface.

* * * * *